(12) United States Patent
Dauchy et al.

(10) Patent No.: US 8,922,216 B2
(45) Date of Patent: Dec. 30, 2014

(54) DEVICE FOR MEASURING BATTERY VOLTAGE AND RELATED MONITORING DEVICE

(75) Inventors: Julien Dauchy, Chatte (FR); Daniel Chatroux, Teche (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 457 days.

(21) Appl. No.: 13/502,450

(22) PCT Filed: Oct. 18, 2010

(86) PCT No.: PCT/EP2010/065660
§ 371 (c)(1),
(2), (4) Date: Apr. 17, 2012

(87) PCT Pub. No.: WO2011/048062
PCT Pub. Date: Apr. 28, 2011

(65) Prior Publication Data
US 2012/0200297 A1    Aug. 9, 2012

(30) Foreign Application Priority Data
Oct. 19, 2009 (FR) ...................... 09 05005

(51) Int. Cl.
*G01N 27/416* (2006.01)
*G01R 31/36* (2006.01)
(52) U.S. Cl.
CPC .................................. *G01R 31/3658* (2013.01)
USPC ........................................................ 324/426
(58) Field of Classification Search
CPC ......... H02J 7/00097; H02J 7/041; H02J 7/22; H02J 7/0031; Y02E 60/12; H01M 10/44; H01M 10/443; H01M 10/0525; Y02B 40/90

USPC ........................................................... 324/426
See application file for complete search history.

(56) References Cited

U.S. PATENT DOCUMENTS 3,863,126 A * 1/1975 Colyn ........................... 320/166
3,867,949 A * 2/1975 Schwalm et al. ............... 607/12
(Continued)

FOREIGN PATENT DOCUMENTS

FR          2826125 A1    12/2002
JP       10 312829 A      11/1998
(Continued)

OTHER PUBLICATIONS

International Search Report, PCT Application No. PCT/EP2010/065660, mailed Dec. 14, 2010 (3 pages).

*Primary Examiner* — Arun Williams
(74) *Attorney, Agent, or Firm* — Occhiuti & Rohlicek LLP

(57) ABSTRACT

The invention relates to a device for measuring battery voltage including an accumulator (Ai), characterized in that said measuring device comprises: an alternating current generator (II), at least one first diode ($D1_i$) and at least one second diode ($D2_i$) arranged in series such that said first diode ($D1_i$) is connected to the positive pole (+) of said accumulator (Ai) by means of the cathode thereof and to the cathode of said second diode ($D2_i$) by means of the anode thereof and such that said second diode (D2i) is connected to the negative pole (−) of said accumulator (Ai) by means of the anode thereof and to the anode of said first diode ($D1_i$) by means of the cathode thereof, a reading capacitor (C1) connected to the central point (N) between said first ($D1_i$) and second ($D2_i$) diodes and to a means (3) for determining the voltage across the terminals of said accumulator (Ai) from the voltage variation at the central point (N).

8 Claims, 2 Drawing Sheets

(56) References Cited

U.S. PATENT DOCUMENTS

| | | | | |
|---|---|---|---|---|
| 4,376,266 | A | * | 3/1983 | Raffoux .................. 324/426 |
| 5,477,128 | A | * | 12/1995 | Iizuka et al. ............... 320/163 |
| 5,546,003 | A | | 8/1996 | Noworolsk |
| 5,754,028 | A | * | 5/1998 | Vezzini .................... 320/125 |
| 6,278,280 | B1 | | 8/2001 | Horie |
| 6,497,974 | B2 | * | 12/2002 | Fuglevand ................. 429/432 |
| 2004/0217737 | A1 | * | 11/2004 | Popescu .................... 320/128 |
| 2007/0290674 | A1 | | 12/2007 | Bolz |
| 2008/0116855 | A1 | * | 5/2008 | Augesky et al. ............. 320/166 |
| 2008/0252266 | A1 | * | 10/2008 | Bolz et al. ................. 320/166 |

FOREIGN PATENT DOCUMENTS

| | | |
|---|---|---|
| JP | 11-32443 | 2/1999 |
| JP | 2007507699 | 3/2007 |
| WO | WO03/032464 | 4/2003 |

\* cited by examiner

DEVICE FOR MEASURING BATTERY VOLTAGE AND RELATED MONITORING DEVICE

CROSS-REFERENCE TO RELATED APPLICATIONS

This application is the National Stage of International Application No. PCT/EP2010/065660, filed on Oct. 18, 2010, which claims the benefit of the priority date of French Application No. 0905005, filed on Oct. 19, 2009. The content of these applications is hereby incorporated by reference in its entirety.

FIELD OF DISCLOSURE

The invention relates to a measuring device for batteries of electrochemical accumulators, which can be used in particular in the field of electrical and hybrid transport and the embedded systems.

The invention relates in particular to the batteries of lithium-ion type (Li-ion) which are well suited to this kind of application, because of their capacity to store a strong energy with a low weight.

BACKGROUND

The expression "battery of accumulators" is used to mean the series connection of a number of accumulators or of accumulators in parallel.

The charging of an accumulator is reflected in an increase in the voltage at its terminals. An accumulator is considered to be charged when it has reached a voltage level defined by the electrochemical process.

Furthermore, the lithium-ion technology batteries have a minimum threshold voltage below which the accumulators of the battery may be damaged or destroyed, which can result in malfunctioning of the battery, for example the current is blocked and the battery no longer delivers any energy.

Furthermore, in a circuit using a number of accumulators connected in series, it is highly probable that the level of charge of each accumulator is not the same. This is because it is possible for one accumulator to be discharged before the other accumulators of the battery.

Consequently, it is essential to stop the discharging of the battery when the voltage of the least charged accumulator falls below the minimum threshold voltage, even if there is still energy in the other accumulators to avoid a malfunctioning of the battery and damage to the least charged accumulator.

It is then essential to monitor in detail the voltage of each accumulator during discharge to check that no accumulator reaches the minimum threshold voltage.

SUMMARY

The objective of the invention is therefore to enable the voltage of each accumulator to be monitored in a simple manner so as to prevent an accumulator from falling below the minimum threshold voltage in order to prevent damage to the accumulator and therefore malfunctioning of the battery.

To this end, the subject of the invention is a voltage measuring device for a battery comprising an accumulator, characterized in that said measuring device comprises:
an alternating current generator,
at least one first and at least one second diodes connected in series, such that said first diode is linked to the positive pole of said accumulator by its cathode and to the cathode of said second diode by its anode, and said second diode is linked to the negative pole of said accumulator by its anode and to the anode of said first diode by its cathode,
a reading capacitor linked to the alternating current generator and to the mid-point between said first and second diodes, and to a means for determining the voltage at the terminals of said accumulator based on the voltage variation at the mid-point, said determination means comprising:
a third and a fourth rectifying diodes in series such that the anode of the third rectifying diode is linked to the cathode of the fourth rectifying diode and to said reading capacitor,
a filtering capacitor linked on the one hand to the cathode of the third rectifying diode and to the anode of the fourth rectifying diode,
a resistor mounted in parallel with the filtering capacitor.

Such a voltage measuring device comprises, for each accumulator, two diodes and a capacitor, which are components that are simple to implement and therefore allow for the production of circuits that are not particularly complex at low cost, without having an excessive weight or volume, to check that no accumulator of the battery reaches a voltage below a predefined minimum threshold voltage.

Said measuring device may also comprise one or more of the following features, taken separately or in combination:
said first and second diodes have a threshold voltage substantially equal to 0.6 V,
said measuring device also comprises an injection capacitor linked to the current generator and to the mid-point,
said measuring device is a voltage measuring device for a battery comprising at least two accumulators in series, and said device comprises a measuring device for one of the accumulators, a first and a second diodes in parallel with each accumulator, a plurality of link capacitors respectively linking two consecutive mid-points, said plurality of link capacitors being mounted in series, the determination means determining the lowest voltage at the terminals of the accumulators,
the measuring device also comprises an injection capacitor linked to the alternating current generator on the one hand and to any mid-point on the other hand,
the third and fourth rectifying diodes are configured to subtract the threshold voltages of said first and second diodes from the voltage signal passing through said third and fourth rectifying diodes, so as to retain only the voltage information relating to the accumulator,
said measuring device comprises at least one booster capacitor mounted in parallel with a predetermined number of the link capacitors,
the alternating current generator is implemented by a voltage generator and a resistor which are mounted in series, said voltage generator generating a square signal with a frequency of 100 kHz and an amplitude of 0 to 10 V.

The invention also relates to a monitoring device comprising a measuring device according to the invention, characterized in that it comprises a means for comparing the measured voltage of said accumulator to a predefined threshold voltage and a control device for stopping the discharging of the battery when said measured voltage is below the predefined threshold voltage.

The invention also relates to a battery of accumulators incorporating such a monitoring device.

This battery is, for example, a lithium-ion battery.

Other features and advantages of the invention will emerge from the following description, given as a nonlimiting example, in light of the appended drawings in which:

BRIEF DESCRIPTION OF THE FIGURES

In these figures, identical elements are given the same references.

DETAILED DESCRIPTION

Figure 1:
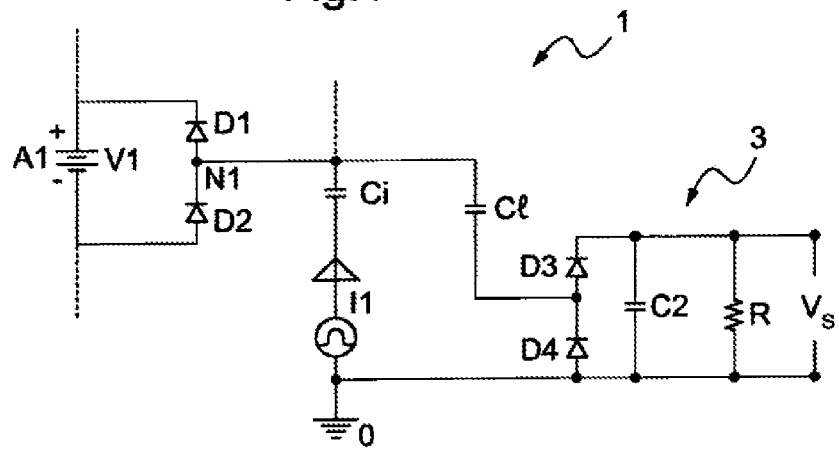
FIG. 1 schematically represents a device for measuring the voltage of an accumulator of a battery, FIG. 2 schematically illustrates a device for measuring the voltage of two accumulators of a battery, and FIG. 3 schematically represents a device for measuring the voltage of a number of accumulators in series of a battery comprising booster capacitors.

FIG. 1 illustrates an embodiment of a voltage measuring device 1 for an accumulator battery that makes it possible to measure the voltage of an accumulator Ai, in this case A1, of the battery.

The measuring device 1 comprises:
- an alternating current generator I1, or in a variant, a voltage generator generating, for example, a square signal with a frequency of 100 kHz and amplitude of 0 to 10 V and a resistor R' in series (FIG. 3),
- a first D1 and a second D2 diodes connected in series (FIG. 1),
- a reading capacitor C1 linked to the mid-point N between the first D1 and second D2 diodes, and to a determination means 3 for determining the voltage at the terminals of the accumulator A1 based on the voltage variation at the mid-point N.

As can be seen in FIG. 1, the first diode D1 is linked to the positive pole + of the accumulator A1 by its cathode and to the cathode of the second diode D2 by its anode, and the second diode D2 is linked to the negative pole – of the accumulator A1 by its anode and to the anode of the first diode D1 by its cathode.

In the positive alternation of the current I1, the first diode D1 is passing and the second diode D2 is blocked. The current I1 then passes through the first diode D1. The voltage at the mid-point N is then equal to the sum of the voltage of the accumulator A1 on the positive pole + with the threshold voltage of the first diode D1.

On the other hand, in the negative alternation, it is the second diode D2 which is passing and the first diode D1 which is blocked. The current then passes through the second diode D2. The voltage at the mid-point N is then equal to the sum of the voltage on the negative pole – of the accumulator A1 with the threshold voltage of the second diode D2.

Consequently, the voltage variation at the mid-point N is equal to the sum of the voltage V1 of the accumulator A1 with the threshold voltages of the first D1 and second D2 diodes.

As an example, the first D1 and second D2 diodes have a threshold voltage of 0.6 V. For a voltage V1 for example of 2.6 V of the accumulator A1, the voltage variation at the mid-point N is therefore equal to 3.8 V.

The voltage signal which arrives at the reading capacitor C1 is a signal exhibiting a signal variation amplitude which corresponds to the voltage variation at the mid-point N and a DC (Direct Current) component.

The reading capacitor C1 eliminates the DC component so as to have only information concerning the signal variation amplitude.

Moreover, in the example illustrated, the determination means 3 comprises:
- a third D3 and a fourth D4 rectifying diodes in series such that the anode of the third rectifying diode D3 is linked to the cathode of the fourth rectifying diode D4 and to the reading capacitor C1,
- a filtering capacitor C2 linked on the one hand to the cathode of the third rectifying diode D3 and to the anode of the fourth rectifying diode D4, and
- a resistor R mounted in parallel with the filtering capacitor C2.

The passage of the voltage signal in the two rectifying diodes D3 and D4 rectifies this signal to obtain a signal of constant sign and also makes it possible to subtract the threshold voltages of the first D1 and second D2 diodes.

The signal is then filtered with the filtering capacitor C2 which makes it possible to obtain a substantially DC voltage.

The voltage Vs measured at the terminals of the resistor R is then substantially equal to the voltage V1 at the terminals of the accumulator A1.

Such a measuring device forms part of a voltage monitoring device for a battery.

The voltage Vs can then be transmitted to a comparator of the monitoring device (not represented) which compares the measured voltage Vs to a predefined threshold voltage, and when the measured voltage Vs is below the threshold voltage, a control device of the monitoring device stops the discharging of the battery for example by disconnecting the battery from the discharge system in which it is installed.

Furthermore, for greater accuracy, it is possible to provide an injection capacitor Ci linked to the mid-point N, and to the current generator I1.

Figure 2:
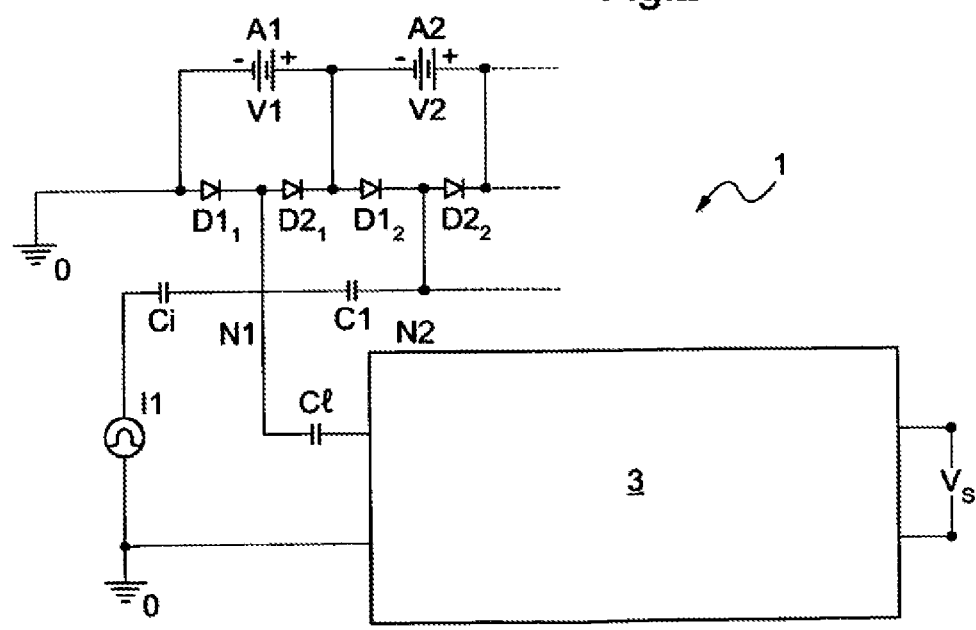
Figure 3:
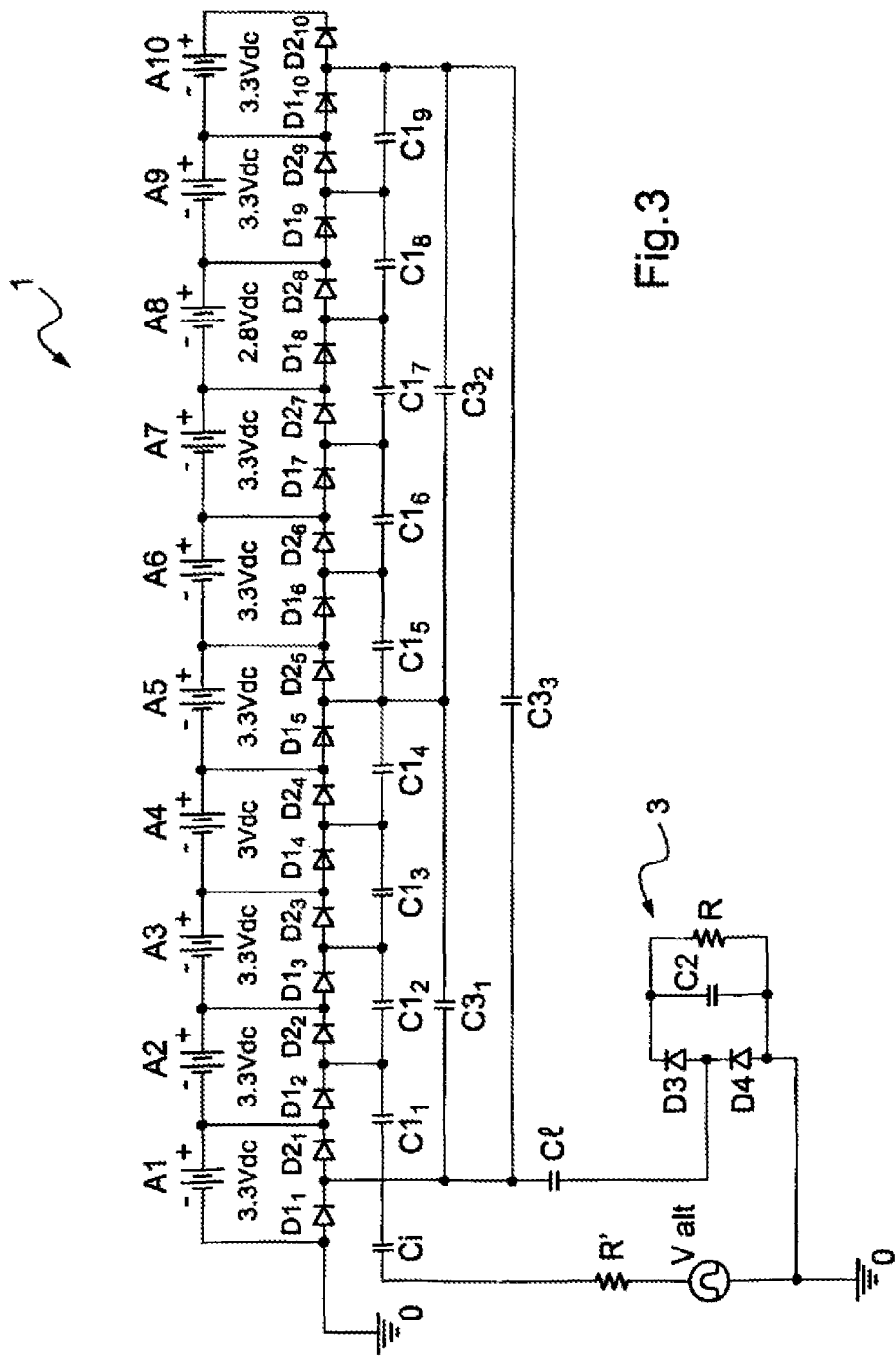

FIGS. 2 and 3 illustrate a second embodiment in which the measuring device makes it possible to monitor the voltage of each accumulator Ak of a battery comprising a number of accumulators Ak connected in series.

The example of FIG. 2 shows two accumulators A1 and A2 connected in series.

In parallel with each accumulator A1, A2, a first and a second diodes are provided $D1_1$, $D2_1$ respectively $D1_2$, $D2_2$. A link capacitor C1 links the two mid-points $N_1$ and $N_2$, respectively between the two diodes $D1_1$, $D2_1$, and the two diodes $D1_2$, $D2_2$, and a reading capacitor C1 is linked to the determination means 3 and to the mid-point $N_1$, or equally to the mid-point $N_2$ between the diodes $D1_2$ and $D2_2$ instead of the mid-point $N_1$. The example illustrated in FIG. 2 for the accumulator A1 therefore shows the measuring device of FIG. 1 for one Aj of the accumulators.

As an example, the accumulator A1 has a voltage V1 less than the voltage V2 of the accumulator A2. In this case, in the positive alternation of the current I1, it is the first diode $D1_1$ of the accumulator A1 which is passing and the second diode $D2_1$ of the accumulator A1 which is blocked, and the current I1 passes through the first diode $D1_1$. And, in the negative alternation, it is the second diode $D2_1$ of the accumulator A1 which is passing and the first diode $D1_1$ of the accumulator A1 which is blocked, and the current I1 passes through the second diode $D2_1$.

The amplitude of the voltage present at the mid-points is identical on all the mid-points $N_1$, $N_2$, only the DC component of the signal is different. This voltage amplitude is equal to the sum of the voltage of the accumulator A1 that has the lowest voltage with the threshold voltages of the first $D1_1$ and second $D2_1$ diodes.

The measurement of the voltage of the accumulator A1 that has the lowest voltage is therefore done on any of the mid-points $N_1$, $N_2$ using the determination means 3.

Furthermore, by absorbing current, the accumulator A1 that has the lowest voltage is charged. Because of this, its voltage increases until it reaches the voltage of the accumulator A2 which is the most charged. The accumulators of the battery are thus balanced.

The measuring device 1 may also comprise an injection capacitor Ci linked to the alternating current generator I1 and to any mid-point $N_k$, in this case the mid-point $N_1$ between the diodes $D1_1$ and $D2_1$ associated with the accumulator A1.

In the example of FIG. 3, the measuring device 1 is used to monitor the voltage of 10 accumulators Ak (1≤k≤10) in series of a battery.

Nine link capacitors C1m, in which m varies from 1 to 9 in this example, respectively link two consecutive mid-points and are mounted in series. An injection capacitor Ci can also be provided, linked on the one hand to the alternating current generator and on the other hand to any mid-point.

As for the reading capacitor C1, it is linked to any mid-point, in this case the first mid-point, and to the determination means 3.

Take the case where the accumulator A8 has the lowest voltage, for example 2.6 V whereas the other accumulators A1 to A7, A9 and A10 have a voltage greater than 2.6 V, for example of the order of 3 V for the accumulator A4 or 3.3 V for the other accumulators.

As previously, the amplitude of the voltage present on the mid-points is identical on all the mid-points and is equal to the sum of the voltage of the accumulator A8 that has the lowest voltage with the threshold voltages of the first $D1_8$ and second $D2_8$ diodes.

The determination means 3 can then determine the voltage at the terminals of the accumulator A8 from this voltage variation, for example using third D3 and fourth D4 rectifying diodes and the filtering capacitor C2 as described previously.

Furthermore, by absorbing current, the accumulator A8 that has the lowest voltage is charged, and its voltage increases until it reaches the voltage of the second most discharged accumulator, that is to say the one that has the second lowest voltage, in the example illustrated in FIG. 3 it is the accumulator A4 that has a voltage of the order of 3 V which is the second most discharged accumulator. Thereafter, a number of accumulators among the most discharged with similar voltages will be charged simultaneously until they reach the voltage of the third most discharged element, until all the accumulators have an identical voltage, for example in this case 3.3 V.

Furthermore, in order to guarantee that all the mid-points have the same voltage variation so as to be able to measure the voltage of the least charged accumulator, that is to say the one that has the lowest voltage, regardless of its position, booster capacitors $C3_1$ to $C3_3$ can be added in parallel with the link capacitors $C1_1$ to $C1_9$. In the example illustrated in FIG. 3, the booster capacitor $C3_1$ is mounted in parallel with the capacitors $C1_1$ to $C1_4$, the booster capacitor $C3_2$ is mounted in parallel with the capacitors $C1_5$ to $C1_9$, and the booster capacitor $C3_3$ is mounted in parallel with the capacitors $C1_1$ to $C1_9$.

The components of such a measuring device are therefore simple to implement and inexpensive, in order to know, in a simple manner, when an accumulator crosses the minimum threshold voltage risking causing damage to the accumulator and malfunctioning of the battery.

Furthermore, because of their light weight and their small bulk, these components can be incorporated without difficulty in a battery of accumulators.

Furthermore, since all the components are incorporated in one and the same battery, they are all subjected to the same temperature conditions, so that the drifts of the characteristics of the diodes change together, which ensures a good balance and an accurate measurement regardless of the temperature.

The invention claimed is:

1. An apparatus comprising a voltage measuring device for an accumulator of a battery, said accumulator having a positive pole and a negative pole, said battery comprising at least two accumulators connected in series with each other, said measuring device comprising an alternating current generator, at least one first diode having a first-diode cathode and a first-diode anode, and at least one second diode having a second-diode cathode and a second-diode anode, said first and second diodes being connected in series with each other, said first diode being linked to said positive pole by said first-diode cathode and to said second-diode cathode by said first-diode anode, said second diode being linked to said negative pole by said second-diode anode and to said first-diode anode by said second-diode cathode, a reading capacitor linked to said alternating current generator, to a mid-point between said first and second diodes, and to a means for determining voltage at said accumulator based at least in part on voltage variation at said mid-point, said means for determining voltage comprising a rectifying third diode having a third-diode anode and a third-diode cathode, and a rectifying fourth diode having a fourth-diode anode and a fourth-diode cathode, said third diode and said fourth diode being connected in series such that said third-diode anode is linked to said fourth-diode cathode and to said reading capacitor, a filtering capacitor linked to said third-diode cathode and to said fourth-diode anode, and a resistor mounted in parallel with said filtering capacitor, said apparatus further comprising first and second diodes in series with each other and in parallel with each of said accumulators in series with each other, and link capacitors linking consecutive mid-points between first and second diodes, said link capacitors being arranged in series with each other.

2. The apparatus of claim 1, wherein said first and second diodes have a threshold voltage substantially equal to 0.6 volts.

3. The apparatus of claim 1, further comprising an injection capacitor linked to said alternating current generator and to any one of said consecutive mid-points between diodes.

4. The apparatus of claim 1, wherein said third and fourth diodes are configured to subtract threshold voltages of said first and second diodes from a voltage signal passing through said third and fourth diodes.

5. The apparatus of claim 1, further comprising at least one booster capacitor arranged in parallel with a predetermined number of said link capacitors.

6. The apparatus of claim 1, wherein said alternating current generator comprises a voltage generator and a resistor arranged in series with each other, said voltage generator being configured to generate a square wave signal having a frequency of 100 kilohertz and an amplitude between zero volts and ten volts.

7. The apparatus of claim 1, further comprising means for comparing a measured voltage at any one of said accumulators with a predefined threshold voltage, and a control device for halting battery discharge when said measured voltage is below said predefined threshold voltage.

8. The apparatus of claim 1, wherein said accumulator comprises an accumulator of a lithium ion battery.

* * * * *